United States Patent
Forster

[19]

[11] Patent Number: 5,822,685
[45] Date of Patent: Oct. 13, 1998

[54] MODULATING REFLECTOR CIRCUIT

[75] Inventor: Ian J. Forster, Chelmsford, United Kingdom

[73] Assignee: GEC Marconi, Limited, United Kingdom

[21] Appl. No.: 648,033

[22] PCT Filed: Nov. 30, 1994

[86] PCT No.: PCT/GB94/02619

§ 371 Date: Jun. 26, 1996

§ 102(e) Date: Jun. 26, 1996

[87] PCT Pub. No.: WO95/15500

PCT Pub. Date: Jun. 8, 1995

[30] Foreign Application Priority Data

Nov. 30, 1993 [GB] United Kingdom .................... 9324534

[51] Int. Cl.⁶ ................................. H03C 1/52; H04B 1/68
[52] U.S. Cl. ........................... 455/106; 455/47; 455/104; 455/109; 332/170
[58] Field of Search ............................... 455/106, 73, 82, 455/83, 84, 88, 47, 78, 85, 104, 109; 330/277, 10; 340/825.54; 342/30, 6; 332/170

[56] References Cited

U.S. PATENT DOCUMENTS 3,480,951  11/1969  Freedman ..................................... 342/6
4,591,803  5/1986  Saleh ........................................ 330/277
4,768,000  8/1988  Pavio, Jr. et al. ...................... 332/170
4,978,932  12/1990  Gupta et al. ........................... 333/81 R
4,980,689  12/1990  Kawakami ................................ 342/51
5,305,469  4/1994  Camiade et al. .......................... 455/78
5,319,802  6/1994  Camiade et al. .......................... 455/85

FOREIGN PATENT DOCUMENTS 0 486 364 A1  5/1992  European Pat. Off. .
0 486 367 A1  5/1992  European Pat. Off. .
1 354 947  5/1974  United Kingdom .

*Primary Examiner*—Donnie L. Crosland
*Attorney, Agent, or Firm*—Kirschstein, et al.

[57] ABSTRACT

A modulating reflector circuit arrangement comprising a transistor configured by means of a feedback arrangement upon operation within a linear region of the transistor's current/voltage characteristic to reflect an incoming amplitude modulated signal with an increased amplitude and a modulator operable to modulate power to the transistor with a periodic waveform in which the reciprocal of the period of the periodic waveform is the required sideband frequency of the reflected signal and the waveform is selected such that the arrangement reflects a substantially single sideband signal.

15 Claims, 4 Drawing Sheets

MODULATING REFLECTOR CIRCUIT

BACKGROUND OF THE INVENTION

This invention relates to a circuit arrangement in particular, although not exclusively, for use with a pseudo passive transponder (PPT).

Conventionally PPT's use a diode detector arrangement to detect an incoming signal from an interrogating source. The diode can be operated as a modulated reflector by modulating the incoming signal with information and reflecting it back to the interrogating source. The reflected signal is however of reduced amplitude with respect to the incoming signal which limits the useful range of the transponder. In addition the reflected signal has a double sideband which increases the complexity of the circuitry required at the interrogating source and reduces the spectral efficiency of the system. A need exists therefore for a circuit arrangement for use in a PPT which can be made available at relatively low cost, which can increase the available operating range, and preferably emit energy with only a single sideband.

SUMMARY OF THE INVENTION

This invention provides a circuit arrangement comprising a transistor configured to detect an amplitude modulated signal upon operation within the non-linear relatively low gain region of the transistors current/voltage characteristic, the transistor also being configured by means of a feedback arrangement upon operation within a linear relatively higher current and gain region of the characteristic to reflect the signal with an increased amplitude.

Surprisingly, the applicants have found that a single transistor can be used both as a so called "cold cathode" detector and a reflective amplifier merely by changing the operating conditions of the transistor. As compared to the known diode arrangement, there need not be a significant increase in power consumption.

In a preferred embodiment, the transistor is a field effect transistor (FET) which is switchable between the detect and reflect modes by increasing the drain/source current. With such a device, when operated at microwave frequencies, the feedback can be provided via the intrinsic capacitance between the gate and source of the FET.

According to another aspect of the present invention there is provided a modulated reflector circuit arrangement comprising a transistor configured by means of a feedback arrangement upon operation within a linear region of the transistor's current/voltage characteristic to reflect an incoming amplitude modulated signal with an increased amplitude and modulating means operable to modulate power to the transistor with a periodic waveform in which the reciprocal of the period of the periodic waveform is the required sideband frequency of the reflected signal and the waveform is selected such that the arrangement reflects a substantially single sideband signal.

BRIEF DESCRIPTION OF THE DRAWING

In order that the invention may be well understood, embodiments thereof will now be described by way of example with reference to the accompanying drawings, in which.

DETAILED DESCRIPTION OF THE PREFERRED EMBODIMENTS

Figure 1:
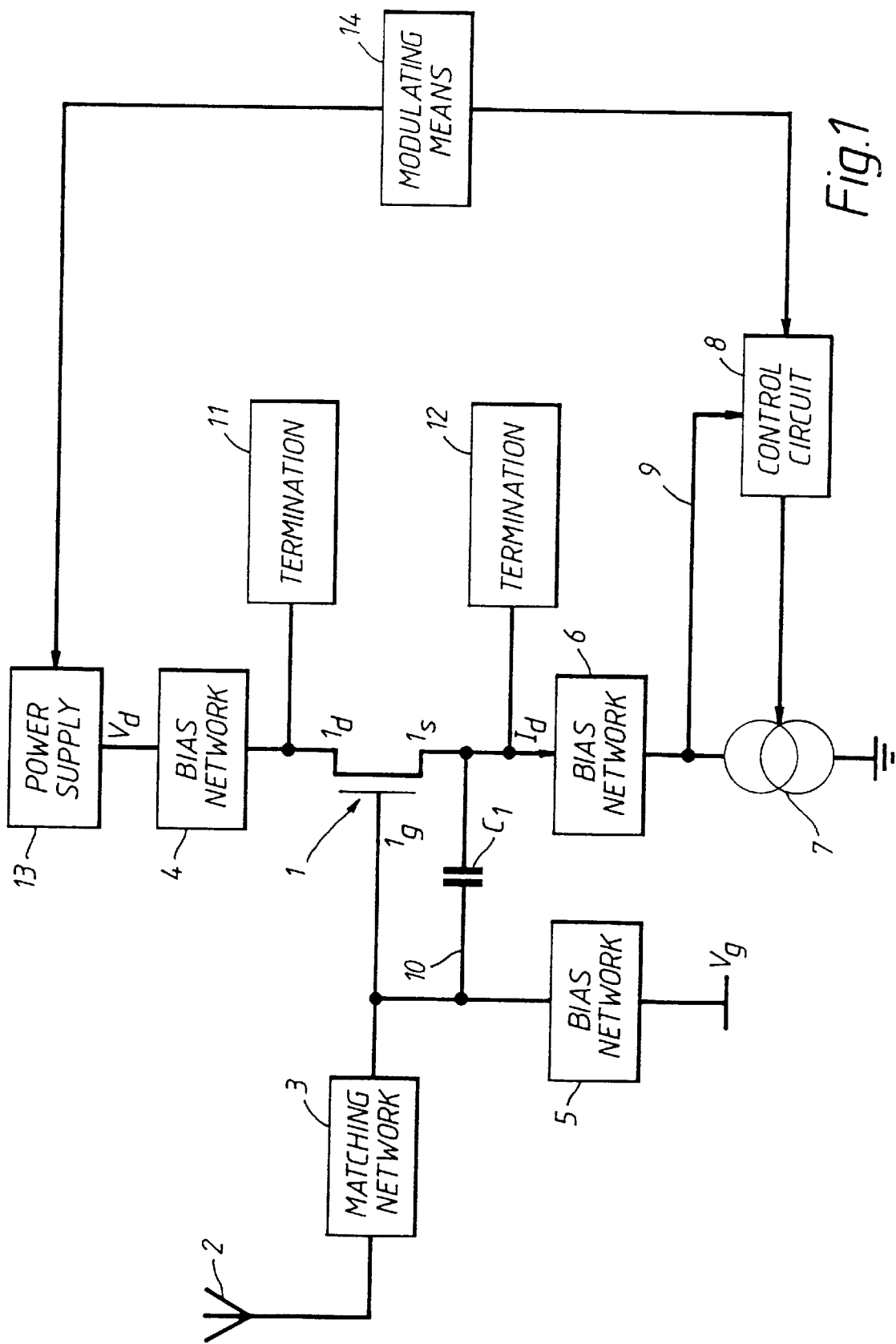
FIG. 1 is a schematic circuit diagram of a circuit arrangement.

As shown in FIG. 1 a circuit arrangement comprises a field effect transistor 1, which can for example be either a silicone JFET or a GaAs device, depending on the required operating frequency. An antenna 2 supplies a signal via a matching network 3 to the gate $1_g$ of the transistor. The drain $1_d$ is connected via a bias network 4 to a power supply 13 producing a rail voltage $V_d$. The bias conditions on the gate side are set by means of an appropriate bias network 5 connected to a voltage rail $V_g$. The source $1_s$ is connected via a bias network 6 to a variable current source 7 which is itself connected to a control circuit 8. The bias networks 4, 5, 6 provide isolation between the relatively low voltage, low frequency signals on the control side, and the typically much higher frequencies with which a transponder is designed to operate.

An output 9 is taken from the source side of the transistor from beyond the bias network 6. Termination circuitry 11, 12 is provided on the drain and source sides. The exact nature of the components will vary depending upon the frequency of operation, but essentially the networks 11, 12 determine the frequency and phase characteristics of the circuit.

A feedback arrangement is provided by a line 10 and capacitor $C_1$. At microwave frequencies it is possible by appropriate selection of the termination circuitry 11, 12 to exploit the intrinsic capacitance between the gate $1_g$ and source $1_s$ to provide the feedback capacitance $C_1$.

Figure 2:
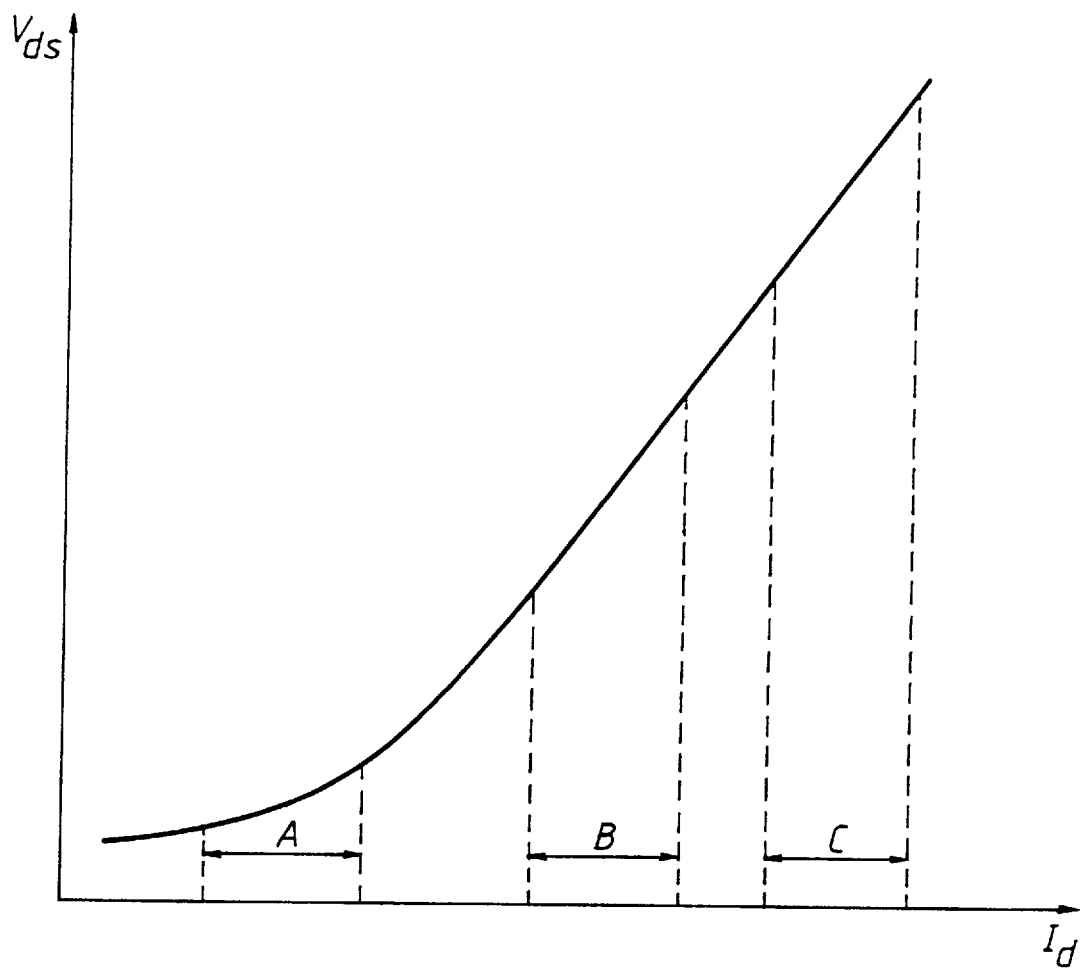
FIG. 2 shows a typical voltage/current characteristic of a FET.

The variable current source 7 can be used under control of control circuit 8 to alter the drain source bias current and thereby cause the circuit to operate in one of three modes as will now be described with reference to FIG. 2. FIG. 2 shows the typical variation in drain source voltage $V_{ds}$ with drain current $I_d$, the so-called transconductance curve of a FET. With the transistor operating within the non linear relatively low gain region A it can, as is well known, thereby act as a detector by amplifying higher amplitude signals relatively more than lower amplitude signals. Increasing the drain current further the transistor operates in the linear relatively higher current and gain region B due to the feedback provided on line 10 and by capacitor $C_1$. The transistor then acts as a negative resistance or amplifier reflecting any incoming signals with an increased amplitude. Information can be transmitted to an interrogation source by modulating the drain source current using the variable current source 7 and control circuit 8. Unlike the prior art diode arrangements, the amplitudes of the information carrying sidebands of the reflected signal when operated as a modulated reflector can be greater than the incoming signal.

As with the prior art diode arrangement the present invention when operated as a modulated reflector produces a double sideband signal. Unlike the prior art arrangement a single sideband signal can however be produced by modulating the power to the transistor 1 with a special form of periodic waveform. Referring to FIG. 1, modulating means 14 controls the power supply 13 and control circuit 8. The modulating means is configured to modulate either the drain source current and/or the rail voltage $V_d$ with a complex periodic waveform, for example a distorted sine wave. The periodic waveform is selected such that the reciprocal of the period of the waveform is equal to the frequency of required sideband. It has been found that modulating the current and/or voltage in this way when in its reflective mode produces a single sideband emission. This is because the sideband energy is generated from two forms of modulation, phase and amplitude. The generated sideband pairs from the two forms of modulation have an opposite phase relationship and therefore when the amplitude of the sidebands is balanced the sidebands on one side cancel whilst the others combine resulting in a single sideband. Modulating the power to the transistor has the effect of modulating the phase and amplitude of the reflection coefficient of the transistor. The concept of modulating the power to the transistor to produce a single sideband emission is considered inventive in itself and accordingly this concept is not restricted to a circuit arrangement which has to be operable both as a detector and as a modulated reflector.

Figure 3:
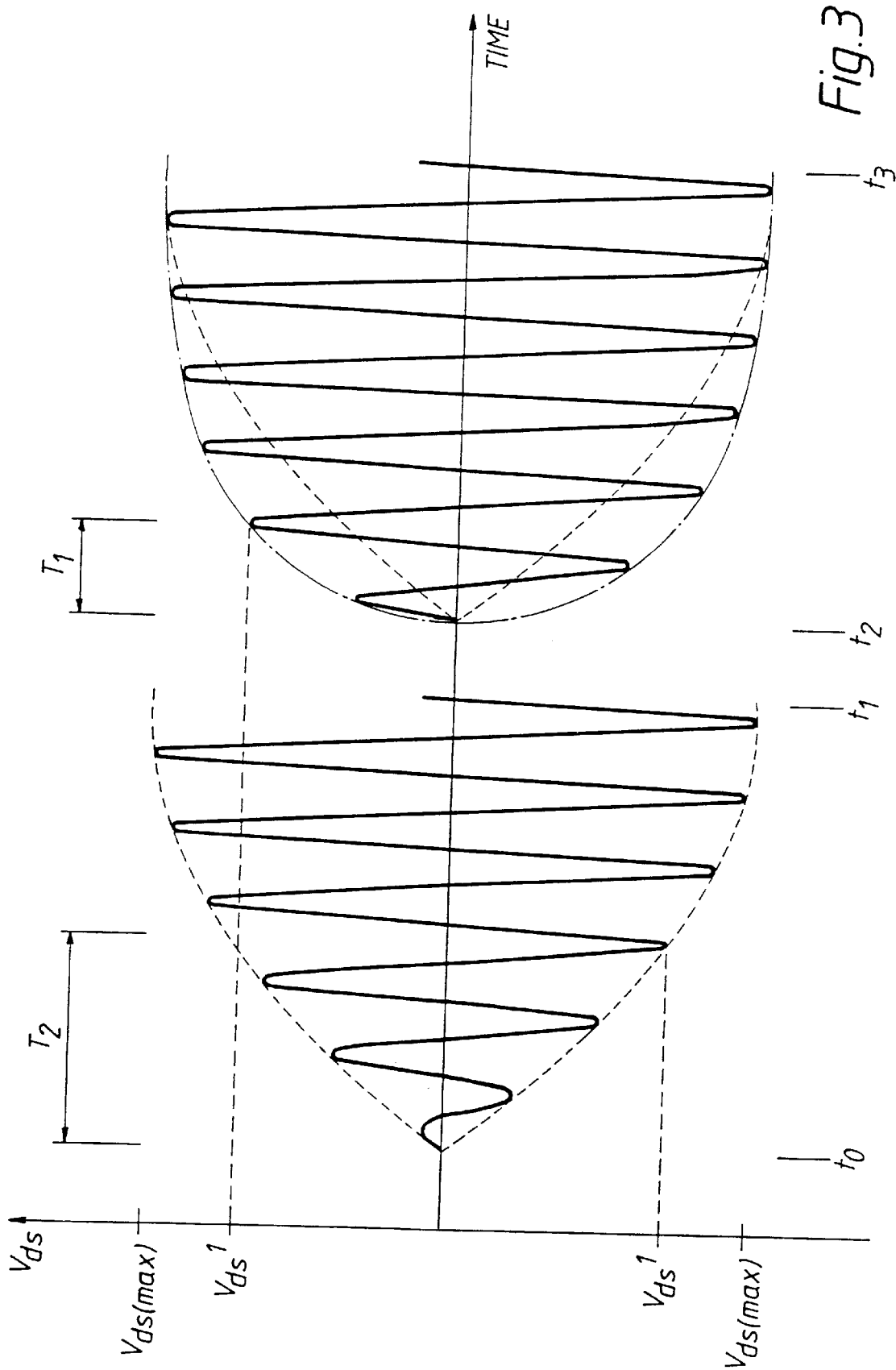
FIG. 3 shows the detected signal in another mode of operation.

The circuit arrangement shown in FIG. 1 can also be operated as a super regenerative receiver further increasing the drain current $I_d$ to region C. In this way the transistor becomes unstable and will oscillate. FIG. 3 shows the drain source voltage $V_{ds}$ varying with time as the variable current source 7 is switched on at times $t_0$ $t_2$ and off at $t_1$, $t_3$ by the control circuit 8. The amplitude of the oscillations increases up to a maximum level $V_{ds(max)}$. The circuit can be used as a sensitive detector due to the fact that an incoming signal to the gate $1_g$ as long as it is at the frequency of oscillation, will lead to a decrease in the rise time $T_1$, as compared to the rise time $T_2$, to reach a given level of oscillation amplitude $V_{ds}^1$ when no such signal is detected. By switching or modulating the variable current source 7 information can be transmitted back to the interrogating source.

Figure 4:
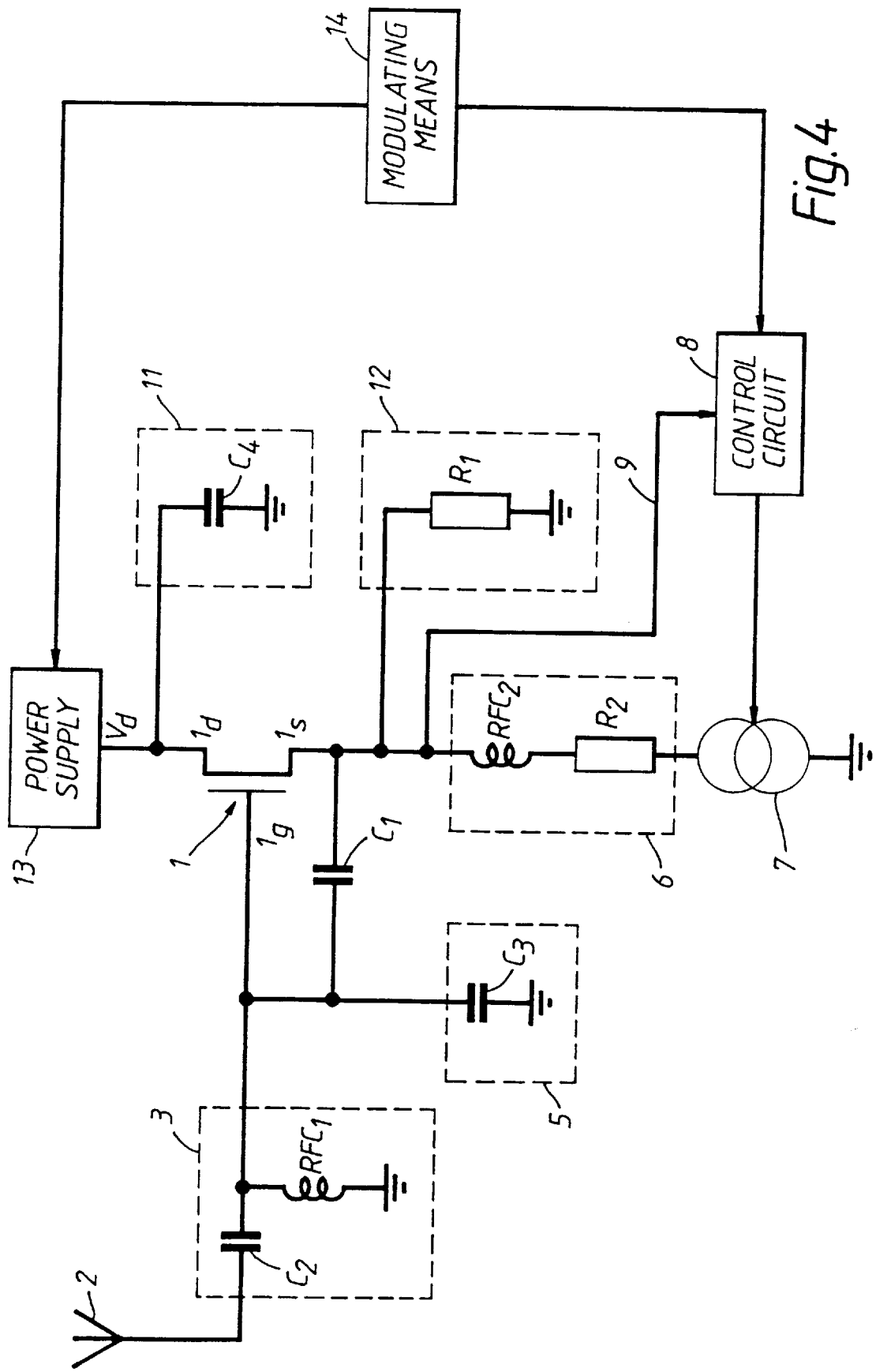
FIG. 4 is a circuit diagram of a circuit arrangement for use at UHF frequencies.

FIG. 4 shows a circuit arrangement typically for use at UHF frequencies. The circuit is generally similar to that shown schematically in FIG. 1 and the same parts are identified with the same reference numerals. The matching network 3 is provided by a capacitor $C_2$ and a choke $RFC_1$. The bias network 5 is provided by a capacitor $C_3$. Termination networks 11, 12 are constituted by a capacitor $C_4$ and resistor $R_1$. The bias network 6 on the output side is provided by a further choke $RFC_2$ and resistor $R_2$ connected in series.

I claim:

1. A modulating reflector circuit for reflecting and modulating incoming signals from a signal source, comprising:
    a) a transistor having input and output terminals connected in a feedback path, said transistor having a current/voltage operating characteristic having a generally linear region;
    b) biasing means for biasing the transistor to operate in said region to reflect the incoming signals with an increased magnitude in a reflect mode; and
    c) modulating means for modulating electrical power to the transistor to modulate the reflected signals, said modulating means being operable to modulate the electrical power such that the reflected modulated signal is a substantially single sideband signal.

2. The reflector circuit, according to claim 1, wherein the modulating means modulates the electrical power supplied to the transistor with a periodic waveform, and wherein the periodic waveform has a time period whose reciprocal is the frequency of said single sideband signal.

3. The reflector circuit, according to claim 2, wherein the periodic waveform is a distorted sine wave.

4. The reflector circuit, according to claim 1, wherein the transistor is a field effect transistor whose input terminal is a gate and having output terminals which are a source and a drain, respectively.

5. The reflector circuit, according to claim 4, wherein the incoming signals are at microwave frequencies, and wherein the field effect transistor has intrinsic capacitance between the gate and the source, said intrinsic capacitance serving as the feedback path at said microwave frequencies.

6. The reflector circuit, according to claim 4, and further comprising a discrete capacitor connected in a conductive line between the gate and the transistor source.

7. The reflector circuit, according to claim 1, and further comprising an antenna coupled to the input terminal of the transistor for transmitting the incoming signals to the input terminal of said transistor.

8. The reflector circuit, according to claim 7, and further comprising a matching network connected in a conductive line between the antenna and the input terminal of said transistor.

9. The reflector circuit, according to claim 1, and further comprising terminations connected to the output terminals of said transistor.

10. The reflector circuit, according to claim 1, and further comprising control means for selectively biasing the transistor to operate in a non-linear relatively lower gain region of the transistor's current/voltage operating characteristic to that of said generally linear region, such that the transistor operates as a detector to detect the incoming signals and any modulation of the signals thereof in a detect mode.

11. The reflector circuit, according to claim 10, wherein the transistor is a field effect transistor whose input terminal is a gate and having output terminals which are a source and a drain respectively, and wherein the control means includes a variable current source connected to the transistor source and drain, and wherein the control means is operative to switch the transistor between said detect and reflect modes by varying electrical current flowing between the transistor source and drain.

12. The reflector circuit, according to claim 1, wherein the transistor is a field effect transistor whose input terminal is a gate and having output terminals which are a source and a drain respectively, and wherein the modulating means is operative to modulate the magnitude of the electrical current flowing between the transistor source and drain.

13. The reflector circuit, according to claim 1, and further comprising control means for selectively biasing the transistor to operate in a relatively higher current region of said operating characteristic in an unstable mode in which the transistor oscillates at an oscillation frequency.

14. The reflector circuit, according to claim 13, wherein the control means includes a variable current source for supplying electrical current to the transistor, and wherein the control means is operative for switching the current source on and off; and further comprising means for detecting an incoming signal having a frequency substantially identical to said oscillation frequency upon decreasing the time taken for the transistor to reach a predetermined level of oscillation.

15. The reflector circuit, according to claim 1, wherein the reflector circuit is used with a transponder for processing amplitude modulated incoming signals.

* * * * *